June 24, 1958 R. L. LONGINI 2,840,497

JUNCTION TRANSISTORS AND PROCESSES FOR PRODUCING THEM

Filed Oct. 29, 1954

INVENTOR
Richard L. Longini.
BY
ATTORNEY

United States Patent Office 2,840,497

Patented June 24, 1958

2,840,497

JUNCTION TRANSISTORS AND PROCESSES FOR PRODUCING THEM

Richard L. Longini, Pittsburgh, Pa., assignor to Westinghouse Electric Corporation, East Pittsburgh, Pa., a corporation of Pennsylvania Application October 29, 1954, Serial No. 465,638

14 Claims. (Cl. 148—1.5)

This invention relates to processes for producing junction transistors and the transistors so produced.

It has long been desirable to produce junction transistors having improved properties so that they may handle substantial amounts of power, be suitable for high frequency applications, and the like. Heretofore, the base resistance of the junction transistors has been a limiting factor in attaining these ends. Consequently, it would be desirable to produce a semiconductor base having a high resistance depletion layer associated with a thin layer of a low resistance doped base material, whereby more efficient junction transistors having a wider field of application may be available.

In the art of producing junction transistors, the processes employed heretofore have been time-consuming and have required numerous separate operations of heating to dope and alloy the various junctions and terminals thereto. Furthermore, the control of the semiconductor regions of a junction transistor as to type and thickness has not been very effective.

The object of the present invention is to provide a relatively simple process for producing junction transistors having a base of a predetermined high resistance and applied superimposed P- and N-type layers.

Another object of the invention is to provide a double diffusion process for providing on intrinsic base material superimposed layers doped with impurity materials to impart thereto opposite types of semiconductivity.

A still further object of the invention is to provide an efficient and versatile junction transistor of either the P–N–I–P or N–P–I–N type.

Other objects of the invention will in part appear obvious and will in part appear hereinafter. For a better understanding of the nature and objects of the present invention, reference should be had to the following detailed description and drawings, in which.

Figure 1:
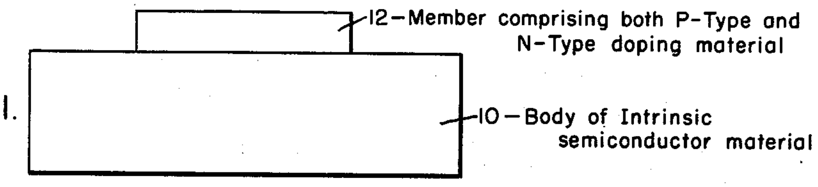
Figure 1 is a view in elevation.

In accordance with the present invention, I have discovered a relatively simple method capable of precise control for producing P–N–I–P and N–P–I–N junction transistors characterized by relatively thick depletion layers of intrinsic semiconductivity. Briefly, in carrying out the process upon one surface of a body of intrinsic semiconductor material of suitable thickness and shape to form a base, there is applied a member in the form of a pellet or button comprising both P-type and N-type doping impurity materials. The member is of a substantially lower melting point than the body. The quantities of P-type and N-type doping material are so correlated to their diffusion rates in the body of semiconductive material at an elevated temperature that the faster diffusing material is present in relatively smaller amount. This assembly of the body of intrinsic semiconductor and member containing both types of doping material is heated in a vacuum or suitable atmosphere to a temperature above that at which the member melts so that it will dissolve a part of the body of semiconductor material immediately in contact therewith. The body of semiconductor material is not subjected to temperatures that might cause it to melt.

Thereafter, the assembly with the molten member present thereon is subjected to differential cooling so that most of the dissolved semiconductor material therein recrystallizes and redeposits back on the semiconductor body as a thin layer containing both types of doping impurity materials redeposited over the entire contact area between the member and the body. The differential cooling is continued until the entire assembly reaches an intermediate temperature and it is maintained at substantially such temperature over a period of time so that both doping materials diffuse into the body of material from the redeposited layer. In this double diffusion step, both doping impurities will be present in the layer of redeposited body material as well as in an adjacent layer immediately below. The amount of the major doping material is substantially greater than that of the other in both of these layers, whereby their semiconductivity will be that of this predominating type. Inasmuch as the doping material present in the smaller amount has a higher diffusion rate, it will predominate in a layer beginning a certain distance away from the redeposited layer into the body of semiconductor material, and this layer will have the opposite type of semiconductivity. This last layer, while relatively thin as compared to the thickness of the body, has a substantial surface area and is in contact at the lower face thereof with the body of intrinsic semiconductive material. This latter layer will be of relatively low resistance as compared to the intrinsic semiconductive body material. The body of semiconductive material with the two diffusion layers of opposite types of semiconductivity and the member are then cooled to room temperature.

The portion of the member above the layers will constitute an emitter to which a suitable terminal may be fastened. An electrode lead is attached to the body of intrinsic semiconductor material for a base electrode. Finally, at some point on the body of semiconductor material separated from the layers, there is subsequently disposed a collector member of the semiconductor material suitably doped to correspond to the type of the redeposited layer and an electrode is fastened thereto. Depending upon the type of doping impurities used, the resultant member will be either a P–N–I–P or an N–P–I–N junction transistor with highly desirable characteristics.

More specifically, the body of intrinsic semi-conductor material may comprise a single crystal of germanium, silicon, silicon-germanium alloy, as set forth in copending R. L. Longini and S. J. Angello application Serial No. 375,416 assigned to the assignee of the present application, or alloy of groups III and V of the period table, such for instance as indium-arsenide, purified to the extent that the body is of high purity and, consequently, of high resistance. For germanium, such intrinsic body will have a resistivity of above 40 ohm centimeters. Usually this intrinsic germanium is inherently N-type. The body may comprise a wafer of a thickness of a few mils and any suitable area. The surface of the body may be polished and etched in accordance with well-known procedures, such as disclosed in Patent 2,653,085, to produce a suitably cleaned and oriented crystal surface. There is then placed upon the upper surface of the body of material a member comprising a pellet having both P-type and N-type doping impurity materials. This assembly is illustrated in Fig. 1 of the drawings where the body 10 may comprise a suitably prepared wafer of germanium and a member 12 comprising a pellet of indium alloyed with approximately 0.01% by weight of arsenic.

The indium will diffuse through germanium much slower than will arsenic.

Figure 2:
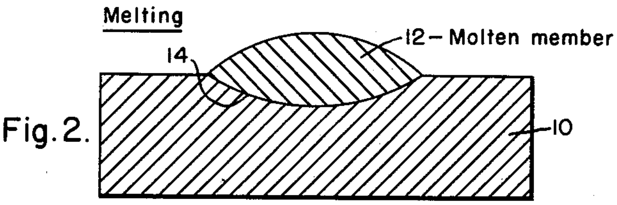
Figs. 2 to 5 are vertical cross sections illustrating the process of making a junction transistor in accordance with the invention.
Figure 3:
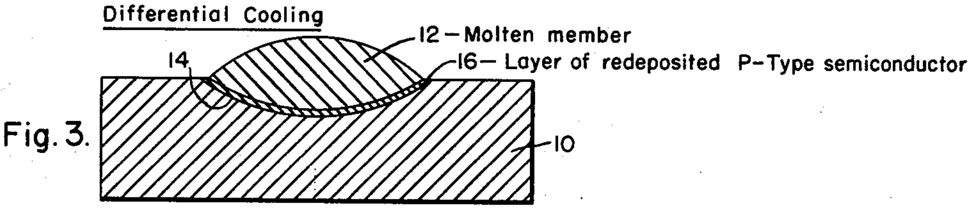

The assembly of Fig. 1 is then placed within an oven under vacuum or in a suitable protective atmosphere, such as hydrogen, argon or helium, and heated to a temperature well above that required to cause the member 12 to melt. A suitable temperature is 675° C. for indium base alloy pellets. As illustrated in Fig. 2 of the drawings, within a short period of time, the molten member 12 dissolves a portion of the germanium body 10 in immediate contact with it thereby producing a shallow depression 14 in the upper surface in which the molten mass rests. Thereafter, the assembly is differentially cooled in such a way that a temperature differential or gradient is set up between the germanium body 10 and the molten member 12, the member 10 being slightly cooler than the member 12. This may be effected by placing the wafer 10 on a cooled graphite slab. The temperature of the member 12, for example, may be 650° C. at this point, while that of the body 10 is a few degrees lower. Under these conditions, the germanium dissolved in the member 12 will recrystallize and redeposit as a layer 16 on the walls of the cavity 14 as shown in Fig. 3. The redeposited germanium in layer 16 will be doped with indium as a major and predominating impurity and arsenic as a minor impurity.

The entire assembly 10—12 is held at a temperature of approximately 650° C. for a period of time of the order of an hour to permit diffusion of the indium and arsenic from the layer 16 and into the body 10 of germanium. In practice, I find it convenient to maintain a temperature gradient so that the member 12 is at approximately 650° C. while the body 10 is slightly cooler. A temperature differential may or may not be present without any material difference in the diffusion procedure. Inasmuch as the arsenic diffuses much more rapidly than indium, at the end of this period there will be located furthest away from member 12 and deepest in body 10 a first diffusion layer 18 having arsenic present in predominating amounts and a second contiguous diffusion layer 20 interposed between the redeposited layer 16 and the first diffusion layer 18. The layer 20 will have as its predominant doping impurity indium and, consequently, the layer 20 will be P-type while the first diffusion layer 18 will be N-type. The layers 16, 18 and 20 are superimposed on each other and will be substantially coextensive. The member 12 will constitute the emitter portion of the transistor. From transistors made in accordance with the process, I find that the thickness of each of the layers 16 and 18 will be of the order of a micron, while layer 20 will be about a 0.1 micron. However, these thicknesses are not critical and may be varied. It will be apparent that layers 16 and 20 constitute a single P-type layer for all practical purposes and they are restricted to the region in immediate contact with emitter 12. The first diffusion layer 18 is sufficiently doped so that its resistance is considerably less than that of the intrinsic germanium in body 10 and it has high lateral conductivity. The layer 18 will have a resistivity of the order from about 0.1 to 1 ohm centimeter.

The entire process shown in Figs. 1 to 4 can be carried out in a short period of time of the order of an hour. After the member shown in Fig. 4 of the drawing has been produced, the entire assembly can be cooled to room temperature.

Figure 4:
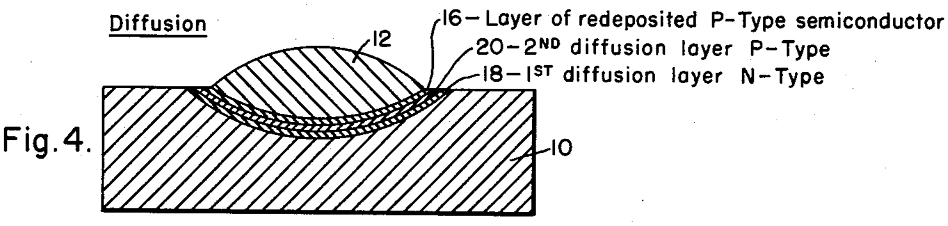
Figure 5:
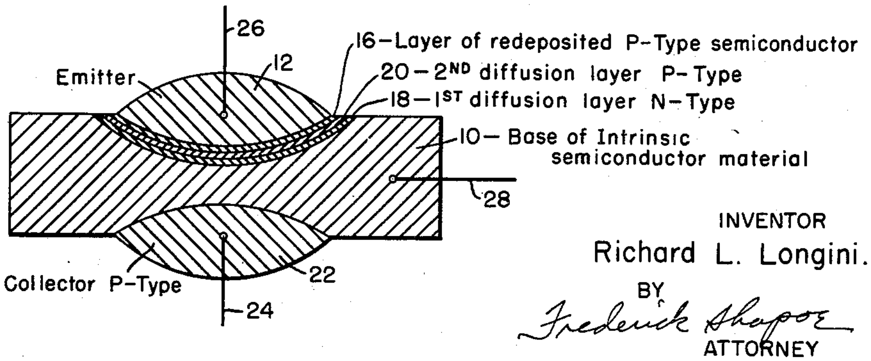

In order to prepare a suitable transistor from the member shown in Fig. 4 of the drawings, there is subsequently fused a collector junction comprising P-type germanium to the body 10 at some point remote from the layers 18 to 20. As shown in Fig. 5 of the drawings, a P-type collector 22 is fused to the bottom surface of the body 10. A lead 24 may be then attached to the collector 22, a lead 26 is attached to the emitter member 12, and a lead 28 is attached to the body 10 to provide for a base electrode. The collector 22 may comprise a pellet of indium. The complete transistor as illustrated in Fig. 5 is a P–N–I–P transistor.

In producing the junction transistors, the indium base member 12 may include phosphorus or antimony instead of the arsenic. For example, 20 parts of antimony or one part by weight of phosphorus may be substituted for each part of arsenic. Also, aluminum may be substituted for the indium. Using aluminum in member 12 as the P-type doping impurity, the arsenic present in the member 12 may be increased to one percent. In some cases, the member 12 may comprise a body of lead doped with indium and arsenic in the proportions of roughly 1,000 to 10,000 parts of indium per part of arsenic.

Junction transistors may be prepared from single crystals of silicon in the same manner as described herein employing, for instance, a member 12 comprising 99% aluminum and 1% arsenic with the assembly of Fig. 1 being heated to about 825° C. to melt the aluminum and to cause it to dissolve a part of the silicon. The assembly may be then cooled to a temperature of about 780° C. with a temperature differential sufficient to cause silicon to redeposit as a layer on the silicon body. Thereafter, the double diffusion may be carried out at a temperature of approximately 780° C. for a period of several minutes. Other suitable P-type and N-type doping impurities for silicon are indium and lithium, respectively.

The junction transistor produced by the process of this invention such as shown in Fig. 5 of the drawings has numerous desirable advantages. The body 10 is substantially pure and, consequently, has a high breakdown voltage. The highly N-type layer 18 has low resistance and, consequently, has a reduced lateral resistance and permits the use of thinner bases which will provide advantages for high frequency applications. Furthermore, a very high percentage of the surface area of the base or body 10 is effective for transistor purposes whereby it may be employed for switching units and other applications requiring high currents for effective operation.

The body 10 may be initially provided with an N-type doped surface layer over the entire upper surface prior to applying the member 12 thereto. This may be accomplished by exposing it to the vapors of arsenic or other N-type doping material in a vacuum coating device and heating it to 500° C. to 600° C. for a few minutes so as to produce a thin N-type surface. Thereafter, pellets 12 may be applied and the entire assembly processed as shown in Figs. 1 to 4. However, the base terminal 28 can be connected to the N-type surface layer which will extend from layer 18 and connect thereto.

It will be appreciated that the specific procedure described herein is for producing P–N–I–P transistors. In producing N–P–I–N junction transistors from silicon, use of a faster diffusing P-type impurity in combination with a slower diffusing N-type impurity will enable N–P–I–N junction transistors to be produced.

It will be understood that the specific materials mentioned above are only illustrative and other materials having similar properties may be substituted.

I claim as my invention:

1. In the process of producing a junction transistor, the steps comprising applying to a body of substantially intrinsic, high resistivity crystalline semiconductor material, a member melting at a lower temperature than said body, said member comprising (1) a small proportion of a first doping material to confer a first type of semiconductivity, the first doping material being fast diffusing, and (2) a large proportion of a second doping material conferring the opposite type of semiconductivity, the second doping material being slower diffusing than said first doping material, heating the body and applied member to a temperature to cause the member to melt and to dissolve therein a part of the body material in immediate contact therewith, cooling the body and molten member to a lower temperature with a temperature gradient between the member and the body such that the body is slightly cooler than the molten member to cause the body material dissolved in the molten member to redeposit as a layer on the body, maintaining the assembly at a temperature near the temperature at which the member melts to cause diffusion of the two doping materials from the member and from the redeposited layer into the adjacent body material, and finally cooling the assembly, the diffusion producing a first layer of low resistivity body material of the first type of semiconductivity in contact with a large area of the intrinsic body material, a second layer of opposite type of semiconductivity of body material superimposed on the first layer, the second layer including the redeposited body material, and the solidified member being disposed in contact with the entire second layer.

2. The process of claim 1, wherein the body comprises semiconductor material selected from the group consisting of germanium, silicon and germanium-silicon alloys.

3. The process of claim 1, wherein the member comprises indium as the second type of doping material having present a small amount of N-type doping material of higher diffusion than the indium.

4. The process of claim 1, wherein the body comprises a semiconductor body in which the surface in contact with the member is doped with the first type of doping impurity to provide a thin layer of low resistivity.

5. In the process of producing P–N–I–P and N–P–I–N junction transistors, the steps comprising applying to a body of substantially intrinsic, high resistivity crystalline semiconductor material, a member melting at a lower temperature than said body, said member comprising (1) a small proportion of a first doping material to confer a first type of semiconductivity, the first doping material being fast diffusing, and (2) a large proportion of a second doping material conferring the opposite type of semiconductivity, the second doping material being slower diffusing than said first doping material, heating the body and applied member to a temperature to cause the member to melt and to dissolve therein a part of the body material in immediate contact therewith, differentially cooling the body and molten member such that the body is slightly cooler than the molten member to cause the body material dissolved in the molten member to redeposit as a layer on the body, thereafter maintaining the assembly at an intermediate temperature near the temperature at which the member melts to cause diffusion of the two doping materials from the member through the redeposited layer and into the adjacent body material, cooling the assembly, the diffusion producing a first layer of low resistivity body material of the first type of semiconductivity in contact with a large area of the intrinsic body material, a second layer of opposite type of semiconductivity of body material superimposed on the first layer, the second layer including the redeposited body material, the solidified member being disposed in fused contact with the entire second layer and forming an emitter, then fusing thereto a piece of opposite type of conductivity to the body at a point removed from the layers and the member to provide a collector.

6. In an improved P–N–I–P junction transistor, a body of intrinsic high resistance crystalline semiconductor material, a base contact affixed to the body, a first layer of the body material doped with an N-type doping material to confer N-type conductivity, the first layer having a low resistance, a second layer of the body material superimposed on the first layer and doped with both a P-type and N-type material, the P-type material predominating, the second layer including a layer of redeposited body material, each of the layers being highly uniform and of a thickness of the order of one micron, an emitter contact alloyed to the entire surface of the second layer, a member having P-type semiconductivity alloyed to the body at a point removed from the layers, and a collector contact attached to the member.

7. The transistor of claim 6, wherein the body comprises germanium, and the P-type doping material is indium, and the N-type doping material is selected from the group consisting of arsenic phosphorus and antimony.

8. The transistor of claim 6, wherein the body comprises silicon, the P-type doping material is aluminum and the N-type materials are lithium and arsenic.

9. In the process of producing a junction transistor, the steps comprising applying to a body of substantially intrinsic, high resistivity crystalline semiconductor material, a member melting at a lower temperature than said body, said member comprising (1) a small proportion of a first doping material to confer a first type of semiconductivity, the first doping material being fast diffusing, and (2) a large proportion of a second doping material conferring the opposite type of semiconductivity, the second doping material being slower diffusing than said first doping material, heating the body and applied member to a temperature to cause the member to melt and to dissolve therein a part of the body material in immediate contact therewith, cooling and maintaining the body and member at a lower temperature such that the body is slightly cooler than the molten member to redeposit the dissolved body material as a layer and to cause diffusion of the two doping materials from the member and from the redeposited layer into the adjacent body material, and finally cooling the assembly, the diffusion producing a first layer of low resistivity body material of the first type of semiconductivity in contact with a large area of the intrinsic body material, a second layer of opposite type of semiconductivity of body material superimposed on the first layer, the second layer including the redeposited body material, and the solidified member being disposed in contact with the entire second layer.

10. In the process of producing a junction transistor, the steps comprising applying to a body of substantially intrinsic, high resistivity crystalline semiconductor material, a member melting at a lower temperature than said body, said member comprising (1) a small proportion of a first doping material to confer a first type of semiconductivity, the first doping material being fast diffusing, and (2) a large proportion of a second doping material conferring the opposite type of semiconductivity, the second doping material being slower diffusing than said first doping material, heating the body and applied member to a temperature to cause the member to melt and to dissolve therein a part of the body material in immediate contact therewith, cooling the body and molten member to a lower temperature with a temperature gradient between the member and the body such that the body is slightly cooler than the molten member to cause the body material dissolved in the molten member to redeposit as a layer on the body, maintaining the assembly at substantially the lower temperature with a temperature gradient between the member and the body temperature to cause diffusion of the two doping materials from the member and from the redeposited layer into the adjacent body material, and finally cooling the assembly, the diffusion producing a first layer of low resistivity body material of the first type of semiconductivity in contact with a large area of the intrinsic body material, a second layer of opposite type of semiconductivity of body material superimposed on the first layer, the second layer including the redeposited body material, and the solidified member being disposed in contact with the entire second layer.

11. In the process of producing a junction transistor having a layer of intrinsic crystalline semiconductor material disposed between P-type and N-type junctions therewith, the steps comprising evaporating a thin coating of doping impurity material upon one surface of a wafer of substantially intrinsic crystalline semiconductor material, heating the wafer and vapor deposited coating of the doping material to produce on the wafer a thin surface layer of doped semiconductor material of low resistance, applying to a portion of said surface a member melting at a lower temperature than said body, said member comprising (1) a small proportion of a first doping material to confer a first type of semiconductivity, the first doping material being fast diffusing, the first doping material being of the same type as the thin coating of the evaporating material, and (2) a large proportion of a second doping material conferring the opposite type of semiconductivity, the second doping material being slower diffusing than said first doping material, heating the body and applied member to a temperature to cause the member to melt and to dissolve therein a part of the body material in immediate contact therewith, differentially cooling the body and molten member such that the body is slightly cooler than the molten member to cause the body material dissolved in the molten mmeber to redeposit as a layer on the body, thereafter maintaining the assembly at an intermediate temperature near the temperature at which the member melts to cause diffusion of the two doping materials from the member through the redeposited layer and into the adjacent body material, the diffusion producing a first layer of low resistivity body material of the first type of semiconductivity in contact with a large area of the intrinsic body material and a second layer of opposite type of semiconductivity of body material superimposed on the first layer, the second layer including the redeposited body material, cooling the assembly to solidify the member, the solidified member being disposed in fused contact with the entire second layer and forming an emitter, then fusing thereto a piece of opposite type of conductivity to the body at a point removed from the layers and the member to provide a collector, applying conductors to the solidified member, to the thin surface layer to provide a base connection and to the collector.

12. The process of claim 11 wherein the vapor deposited coating comprises an N-type doping material, and the faster diffusing doping material in the member also comprises an N-type doping material.

13. In an improved P–N–I–P junction transistor, a body of intrinsic high resistance crystalline semiconductor material, a base contact affixed to the body, a first layer of the body material doped with an N-type doping material to confer N-type conductivity, the first layer having a low resistance, a second layer of the body material superimposed on the first layer and doped with both a P-type and N-type material, the P-type material predominating, the second layer including a layer of redeposited body material, each of the layers being highly uniform and of a thickness of the order of one micron, an emitter contact alloyed to the entire surface of the second layer, an evaporated layer of N-type conductivity material applied to the surface of the semiconductor material at the first layer and the base contact being affixed to the body at said evaporated layer, a member having P-type semiconductivity alloyed to the body at a point removed from the layers, and a collector contact attached to the member.

14. In an improved N–P–I–N junction transistor, a body of intrinsic high resistance crystalline semiconductor material, a base contact affixed to the body, a first layer of the body material doped with a P-type doping material to confer P-type conductivity, the first layer having a low resistance, a second layer of the body material superimposed on the first layer and doped with both an N-type and P-type material, the N-type material predominating, the second layer including a layer of redeposited body material, each of the layers being highly uniform and of a thickness of the order of one micron, an emitter contact alloyed to the entire surface of the second layer, an evaporated layer of P-type conductivity material applied to the surface of the semiconductor material at the first layer and the base contact being affixed to the body at said evaporated layer, a member having N-type semiconductivity alloyed to the body at a point removed from the layers, and a collector contact attached to the member.

References Cited in the file of this patent

UNITED STATES PATENTS

| | | |
|---|---|---|
| 2,597,028 | Pfann | May 20, 1952 |
| 2,644,852 | Dunlap | July 7, 1953 |
| 2,689,930 | Hall | Sept. 21, 1954 |
| 2,701,326 | Pfann et al. | Feb. 1, 1955 |
| 2,703,855 | Koch et al. | Mar. 8, 1955 |
| 2,725,315 | Fuller | Nov. 29, 1955 |
| 2,739,088 | Pfann | Mar. 20, 1956 |